US008860074B2

(12) United States Patent
Lee

(10) Patent No.: US 8,860,074 B2
(45) Date of Patent: Oct. 14, 2014

(54) LIGHT EMITTING DEVICE, METHOD OF FABRICATING THE SAME AND LIGHTING SYSTEM HAVING THE SAME

(71) Applicant: Dong Yong Lee, Seoul (KR)

(72) Inventor: Dong Yong Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/771,227

(22) Filed: Feb. 20, 2013

(65) Prior Publication Data
US 2013/0214319 A1   Aug. 22, 2013

(30) Foreign Application Priority Data

Feb. 21, 2012 (KR) .................. 10-2012-0017640

(51) Int. Cl.
H01L 33/00 (2010.01)
H01L 33/52 (2010.01)
H01L 33/48 (2010.01)
H01L 33/60 (2010.01)

(52) U.S. Cl.
CPC ....... *H01L 33/52* (2013.01); *H01L 2224/48247* (2013.01); *H01L 33/60* (2013.01); *H01L 2933/0033* (2013.01); *H01L 2224/48091* (2013.01); *H01L 33/486* (2013.01)
USPC .................................. 257/99; 438/26; 438/27

(58) Field of Classification Search
USPC ................................................ 257/99
See application file for complete search history.

(56) References Cited

U.S. PATENT DOCUMENTS

| 7,518,155 | B2 * | 4/2009 | Ishidu et al. ..................... 257/98 |
| 8,471,285 | B2 * | 6/2013 | Hsu et al. ......................... 257/98 |
| 2005/0001228 | A1 * | 1/2005 | Braune et al. .................... 257/99 |
| 2005/0127377 | A1 * | 6/2005 | Arndt et al. ...................... 257/81 |
| 2007/0034886 | A1 * | 2/2007 | Wong et al. ...................... 257/98 |
| 2008/0099779 | A1 * | 5/2008 | Huang et al. .................... 257/99 |
| 2009/0147498 | A1 | 6/2009 | Park ................................. 362/84 |
| 2010/0182792 | A1 | 7/2010 | Hsiao et al. .................. 362/310 |
| 2010/0187546 | A1 | 7/2010 | Fushimi et al. ................ 257/88 |
| 2010/0193828 | A1 * | 8/2010 | Choi et al. ....................... 257/99 |
| 2010/0230694 | A1 * | 9/2010 | Arndt et al. ..................... 257/98 |
| 2010/0314654 | A1 * | 12/2010 | Hayashi .......................... 257/99 |
| 2011/0309404 | A1 * | 12/2011 | Lee ................................. 257/99 |

(Continued)

FOREIGN PATENT DOCUMENTS

EP         1 953 818 A1   8/2008
KR   10-2009-0130638 A   12/2009

OTHER PUBLICATIONS

European Search Report dated Jun. 19, 2013 issued in Application No. 13 15 5881.

(Continued)

*Primary Examiner* — Yu-Hsi D Sun
*Assistant Examiner* — Grant Withers
(74) *Attorney, Agent, or Firm* — Ked & Associates, LLP

(57) ABSTRACT

Disclosed is a light emitting device. The light emitting device includes a substrate including a plurality of lead electrodes; a mold member including a cavity on the substrate; a light emitting chip in the cavity and on at least one of the lead electrodes; a connecting member for electrically connecting at least one of the lead electrodes to the light emitting chip; a resin member in the cavity; a spacer part between the lead electrodes, the spacer part including a material different from materials of the mold member and the resin member; and an adhesive film between the mold member and the substrate.

20 Claims, 12 Drawing Sheets

(56) References Cited

U.S. PATENT DOCUMENTS

| | | | |
|---|---|---|---|
| 2012/0074451 A1* | 3/2012 | Lin | 257/99 |
| 2013/0187191 A1* | 7/2013 | Takada | 257/99 |
| 2013/0256737 A1* | 10/2013 | Ramchen et al. | 257/99 |
| 2013/0277705 A1* | 10/2013 | Seo et al. | 257/98 |
| 2013/0277708 A1* | 10/2013 | Lin et al. | 257/99 |
| 2013/0334556 A1* | 12/2013 | Park et al. | 257/98 |
| 2014/0008693 A1* | 1/2014 | Feng | 257/99 |
| 2014/0014986 A1* | 1/2014 | Yoshida et al. | 257/91 |

OTHER PUBLICATIONS

European Office Action issued in related Application No. 13155881.9 dated May 9, 2014.

* cited by examiner

LIGHT EMITTING DEVICE, METHOD OF FABRICATING THE SAME AND LIGHTING SYSTEM HAVING THE SAME

The present application claims priority under 35 U.S.C. §119(a) of Korean Patent Application No. 10-2012-0017640 filed on Feb. 21, 2012, which is hereby incorporated by reference in its entirety.

BACKGROUND

The embodiment relates to a light emitting device, a method of fabricating the same and a lighting system having the same.

Light emitting diodes (LEDs) are a kind of semiconductor devices for converting electrical energy into light. Such an LED has advantages such as low power consumption, a semi-permanent life cycle, a fast response time, safety, and environment friendly requirement compared to the related art light source such as a phosphor lamp and an incandescent bulb. Many studies are being in progress in order to replace the existing light sources with LEDs. Also, the LEDs are being increasingly used as light sources for lighting devices, such as various lamps, liquid crystal display devices, electric signboards, and streetlamps used indoors and outdoors.

SUMMARY

The embodiment provides a light emitting device having a novel structure.

The embodiment provides a light emitting device including a substrate having a lead electrode attached under a mold member and a resin member.

The embodiment provides a method of fabricating a light emitting device in which a mold member is coupled to a separate substrate after forming the mold member on a film and then removing the film.

A light emitting device according to the embodiment includes a substrate including a plurality of lead electrodes; a mold member including a cavity on the substrate; a light emitting chip in the cavity and on at least one of the lead electrodes; a connecting member for electrically connecting at least one of the lead electrodes to the light emitting chip; a resin member in the cavity; a spacer part between the lead electrodes, the spacer part including a material different from materials of the mold member and the resin member; and an adhesive film between the mold member and the substrate.

A light emitting device according to the embodiment includes a substrate including a plurality of lead electrodes having a plurality of coupling holes; a mold member including a cavity on the substrate, the mold member being coupled with the coupling holes of the lead electrodes; a light emitting chip in the cavity and on at least one of the lead electrodes; a connecting member for electrically connecting at least one of the lead electrodes to the light emitting chip; a resin member in the cavity; a spacer part between the lead electrodes, the spacer part including a material different from materials of the mold member and the resin member; and an adhesive film between the mold member and the substrate.

DETAILED DESCRIPTION OF THE EMBODIMENTS

Figure 1:
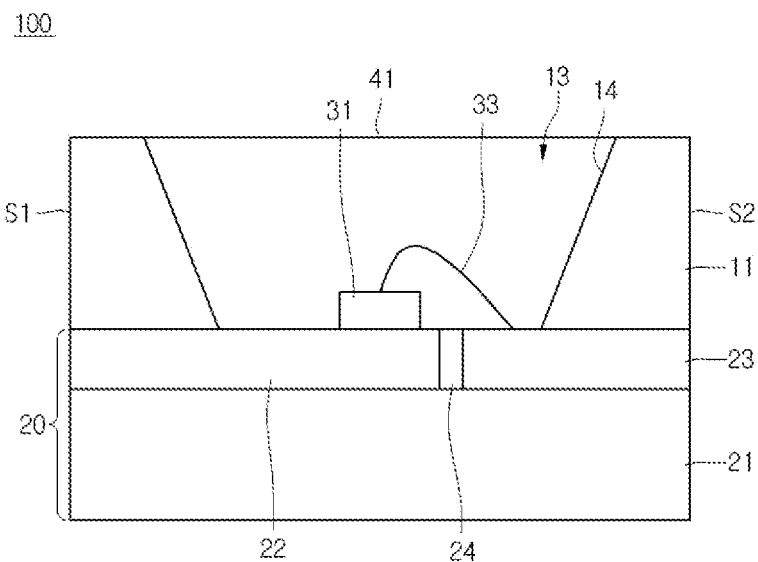
FIG. 1 is a side sectional view of a light emitting device according to the first embodiment.

Hereinafter, an exemplary embodiment of the disclosure will be described with reference to accompanying drawings. In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings. In the drawings, the thickness or size of each layer is exaggerated, omitted, or schematically illustrated for convenience in description and clarity. In the drawings, the thickness or size of each layer is exaggerated, omitted, or schematically illustrated for convenience in description and clarity.

Hereinafter, a light emitting device (LED) according to an embodiment will be described with reference to accompanying drawings.

FIG. 1 is a side sectional view of a light emitting device according to the first embodiment.

Referring to FIG. 1, the light emitting device 100 includes a mold member 11 having a cavity 13, a substrate 20 having first and second lead electrodes 22 and 23 under the mold member 11, a light emitting chip 31 disposed on at least one of the first and second lead electrodes 22 and 23, and a resin member 41.

The mold member 11 may include a material representing reflectance higher than transmittance with respect to the wavelength emitted from the light emitting chip 31. For example, the mold member 11 may include a material representing the reflectance of at least 70%. If the material constituting the mold member 11 has the reflectance of at least 70%, the material constituting the mold member 11 may include a non-transmissive material. The mold member 11 may include thermal setting resin including a silicon-based material, an epoxy-based material or a plastic material, a high heat resistance material, or a high light resistance material. The silicon includes white color based resin. In addition, the mold member 11 may selectively include acid anhydride, an antioxidant, a release agent, an optical reflector, an inorganic filling agent, a curing catalyst, a light stabilizer, a lubricant, or a titanium dioxide. The mold member 11 may be molded by using at least one selected from the group consisting of epoxy resin, modified epoxy resin, silicon resin, modified silicon resin, acrylic resin, and urethane resin. For instance, the mold member 11 can be formed by using B-stage solid epoxy resin composition, which can be obtained by mixing the epoxy resin, such as triglycidylisocyanurate or hydride bisphenol A diglycidylether, with the acid anhydride promoter, such as hexahydro phthalic anhydride, 3-methyl hexahydro phthalic anhydride or 4-methyl hexahydro phthalic anhydride, and then partially hardening the mixture after adding DBU (1.8-Diazabicyclo(5,4,0)undecene-7) serving as a hardening accelerator and ethylene glycol, titanium oxide pigment or glass fiber serving as a promoter to the epoxy resin, but the embodiment is not limited thereto.

In addition, a light shielding material or a dispersing agent is added in the first body 141, thereby reducing transmitting light. In addition, in order to have a predetermined function, the first body 141 includes at least one selected from the group consisting of a dispersing agent, pigments, phosphors, reflective materials, light shielding materials, a light stabilizer, and a lubricant mixed with thermal setting resin.

A cathode mark may be formed at an upper side of the mold member 11. The cathode mark divides the first and second lead electrodes 22 and 23 of the light emitting device 100, so that the confusion about the electric polarities of the first and second lead electrodes 22 and 23 may be prevented.

The cavity 13 is formed in the mold member 11. The cavity 13 has an open top surface and a bottom surface on which the substrate is disposed. When viewed from the top of the device, the cavity 13 may have a shape of a circle, an ellipse or a polygon, but the embodiment is not limited thereto. The cavity 13 may be defined as an open region or opening generated by removing the mold member 11.

A sidewall 14 of the cavity 13 may has a curved or inclined surface, and may be inclined or vertical to the bottom surface of the cavity 13. Outer walls S1 and S2 of the mold member 11 are disposed on the same plane as those of outer walls of the substrate 20 or may be formed in perpendicular with the outer walls of the substrate 20. The first outer wall S1 of the mold member 11 may be disposed on the same plane as an outer wall of the first lead electrode 22 or/and a first outer wall of a support member 21 of the substrate 20. The second outer wall S2 of the mold member 11 is an opposite surface of the first outer wall S1 and may be disposed on the same plane as an outer wall of the second lead electrode 23 or/and a second outer wall of the support member 21. The upper width of the cavity 13 may be larger than the lower width of the cavity 13, but the embodiment is not limited thereto.

The substrate 20 may be disposed under the mold member 11 and the mold member 11 may be adhesive onto the top surface of the substrate 20 by using an adhesive member (not shown). The adhesive member may be an adhesive of a material which is the same as or different from that of the mold member 11. When the material of the adhesive member is the same as that of the mold member 11, an interface may not exist between the adhesive member and the mold member 11. When the material of the adhesive member is different from that of the mold member 11, an interface may exist between the adhesive member and the mold member 11.

The substrate 20 includes a plurality of lead electrodes 22 and 23 and a support member 21. The lead electrodes 22 and 23 are exposed to the lower portion of the cavity 13 and are physically separated from each other. The first lead electrode 22 of the lead electrodes 22 and 23 extends from the region of the cavity 13 under the first outer wall S1 of the mold member 11, and the second lead electrode 22 extends from the region of the cavity 13 under the second outer wall S2 of the mold member 11.

The lead electrodes 22 and 23 include a metallic material, for example, at least one of titanium (Ti), copper (Cu), nickel (Ni), gold (Au), chrome (Cr), tantalum (Ta), platinum (Pt), zinc (Sn), silver (Ag), and phosphor (P). The first and second lead electrodes 22 and 23 may include a structure of multilayer, but the embodiment is not limited thereto. The thicknesses of the first and second lead electrodes 22 and 23 may be 0.1 mm~1.5 mm. The support member 21 supports a plurality of lead electrodes 22 and 23. A spacer part 24 is disposed between the lead electrodes 22 and 23 and maintains a gap between the lead electrodes 22 and 23. The spacer part 24 may include an insulation material such as a solder resist or a metallic oxide, but the embodiment is not limited thereto. The spacer part 24 may be formed of a material different from those of the mold member 11 and the resin member 41.

The width of the spacer part 24 is the same as or larger than that of the gap between the first and second lead electrodes 22 and 23. When an outer portions of the first and second electrodes 22 and 23 are disposed under the mold member 11, a portion of the spacer part 24 may be further disposed under the mold member 11, but the embodiment is not limited thereto.

An upper portion of the spacer part 24 may be formed to protrude from the top surfaces of the first and second lead electrodes 22 and 23 or not.

The support member 21 may be formed by selecting one from a resin material substrate, an FR-4 substrate, a ceramic substrate, and a resin substrate having a metallic layer. The support member 21 may include a structure or a pattern for heat conduction. For example, a concave-convex pattern may be formed on a lower surface of the support member 21 or a heat radiation frame of a metallic material may be further disposed thereof, but the embodiment is not limited thereto. The support member 21 may formed of a material which is different from those of the mold member 11 and the resin member 41, but the embodiment is not limited thereto.

Portions of the lead electrodes 22 and 23 may protrude to the bottom surface of the support member 21 through a side surface or an inside of the support member 21, but the embodiment is not limited thereto.

The substrate 20 may have a thickness of 0.25 mm or above. This thickness may be determined to support the mold member 11 while taking the workability and mobility into consideration.

The first side length among the lengths of the substrate 20 in a horizontal direction may be the same as the first side length of the mold member 11 in the horizontal direction. The outer surfaces of the first and second lead electrodes 22 and 23, which are disposed between the mold member 11 and the support member 21, may extend outward further than the outer walls S1 and S2 of the mold member 11.

The light emitting chip 31 is disposed on at least one of the first and second lead electrodes 22 and 23 disposed on the bottom surface of the cavity 13. The light emitting chip 31 may be realized by using a light emitting diode having a wavelength band of visible light and emitting at least one of red, green, blue and white light, or a light emitting diode having a wavelength band of ultraviolet light, but is not limited thereto.

As shown in drawings, the light emitting chip 31 may be mounted on the first lead electrode 22 and may be electrically connected to the first lead electrode 22. In addition, the light emitting chip 31 may be connected to the second lead electrode 23 through a connecting member 33. The connecting member 33 includes a wire.

The light emitting chip 31 may be realized as a lateral type chip in which two electrodes are disposed in parallel to each other or a vertical type chip in which two electrodes are disposed on sides opposite to each other, but the embodiment is not limited thereto. The lateral type chip may be connected to at least two wires and the vertical type chip may be connected to at least one wire. The light emitting chip 31 may be mounted in a flip way, but the embodiment is not limited thereto.

An adhesive member such as solder paste may be disposed between the light emitting chip 31 and the first lead electrode 22, and may be formed of a conductive material.

The resin member 41 may be disposed in the cavity 13, may include a transmissive resin material such as silicon or epoxy and may be formed in a single or multi layer.

The resin member 41 may include a phosphor for converting a wavelength of light emitted from the light emitting chip 31 and the phosphor may be added into the mold member 41, but the embodiment is not limited thereto. The phosphor excites the light emitted from the light emitting chip 31 to emit the light having another wavelength. The phosphor includes one selected from the group consisting of YAG, TAG, silicate, nitride, and oxy-nitride-based material. The phosphor may include at least one of a red phosphor, a yellow phosphor and a green phosphor, but the embodiment is not limited thereto. A top surface of the resin member 41 may have one of a flat shape, a concave shape, and a convex shape. For example, the top surface of the resin member 41 may be a concave curved surface which may be a light emitting surface.

The resin member 41 may make contact with the top surfaces of the first and second lead electrodes 22 and 23 and the spacer part 24. Further, the resin member 41 may make contact with the light emitting chip 31 and the adhesive member disposed under the light emitting chip 31.

FIGS. 2 to 8 are views illustrating a process of fabricating the light emitting device of FIG. 1.

Figure 2:
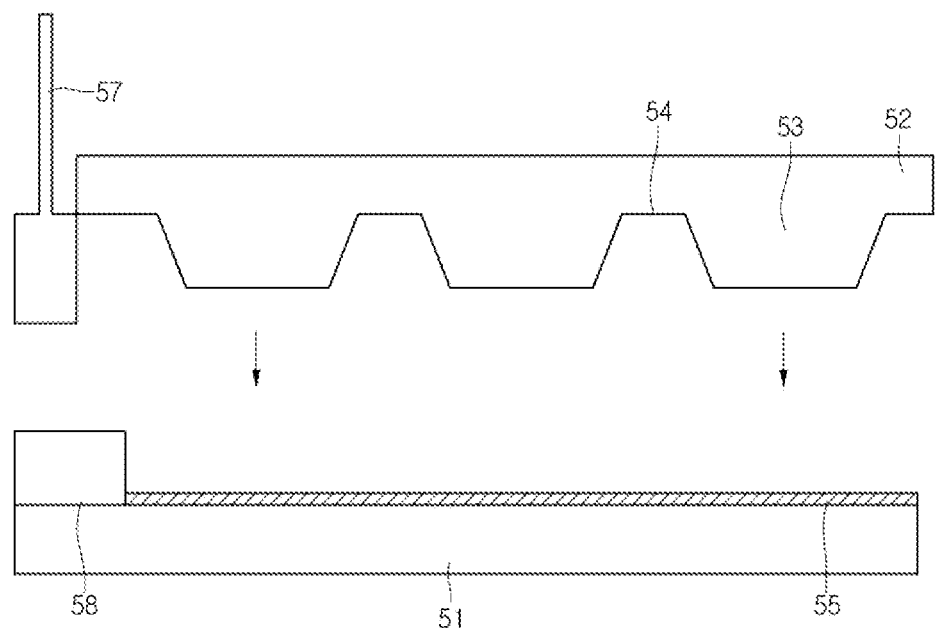
FIGS. 2 to 8 are views illustrating a process of fabricating the light emitting device of FIG. 1.

Referring to FIG. 2, an adhesive film is disposed on a first molding frame 51 and a second molding frame 52 having a convex portion 53 and a concave portion 54 is placed corresponding to the first molding frame 51. In addition, a mold portion 58 is disposed on a portion of the first molding frame 51. An adhesive film 55 includes at least one of a PVC film, a PET (Polyestor) film, PC (Polycarbonate), PS (Polystyrene) and PE (Polyimide) as kinds of resin materials, but the embodiment is not limited thereto. The adhesive film 55 may include an insulation film and may be thicker than an adhesive.

Figure 3:
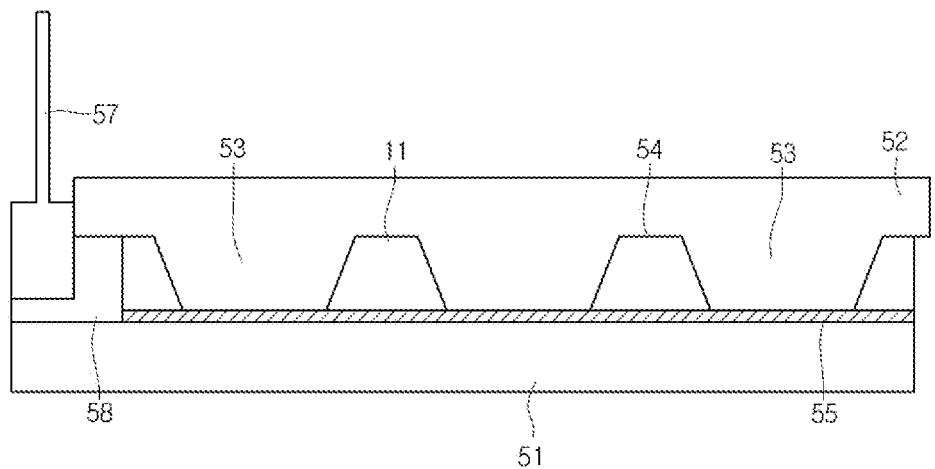

As shown in FIG. 3, after the second molding frame 52 makes dense contact with the first molding frame 51, a transfer 57 which is disposed at one side of the second molding frame 52 is allowed to press the mold portion 58. At this time, a material of the mold portion 58 moves along the concave portion 54 of the second molding frame 52, so that the shape of the mold member 11 is formed on the adhesive film 55.

Figure 4:
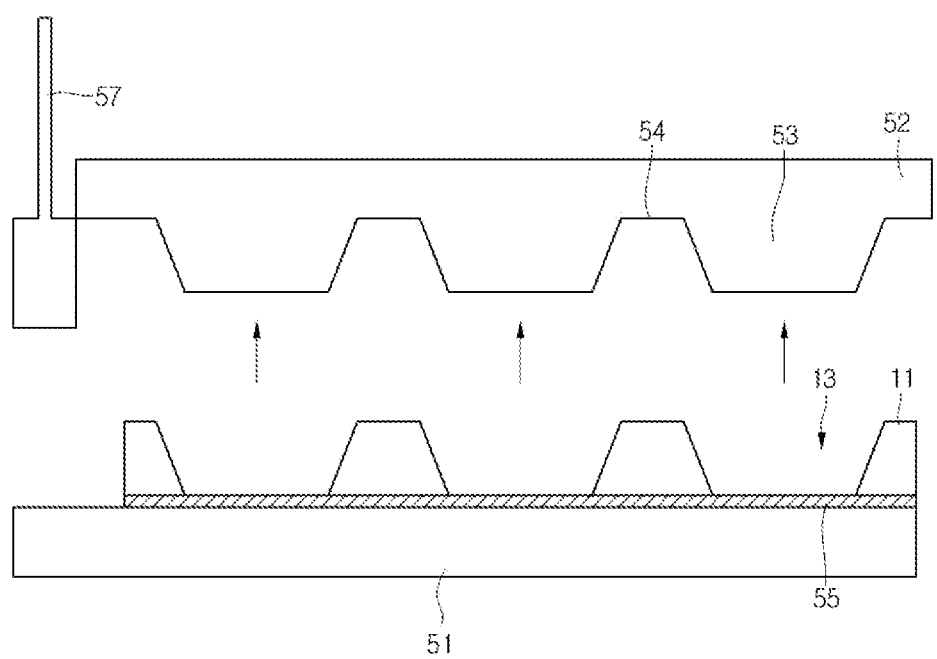

Referring to FIG. 4, when the second molding frame 52 is separated from the first molding frame 51, a convex portion of the second molding frame 52 forms the cavity 13 of the mold member 11.

Figure 5:
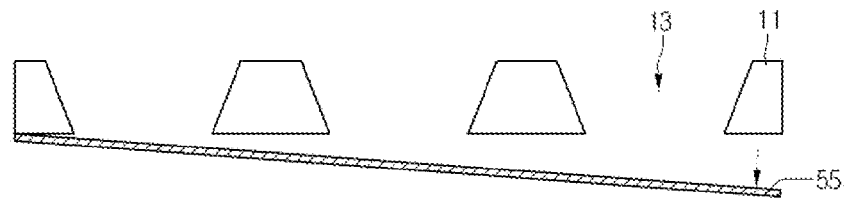

Referring to FIG. 5, the adhesive film 55 is separated from the mold member 11. Thus, the mold member 11 having a plurality of cavities 13 is formed.

Figure 6:
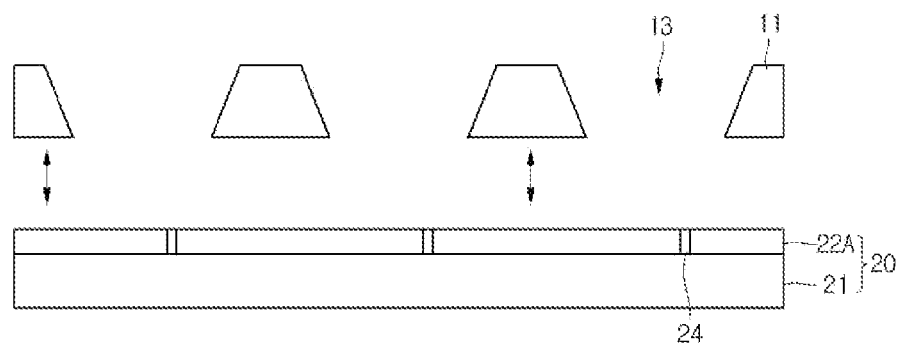
Figure 7:
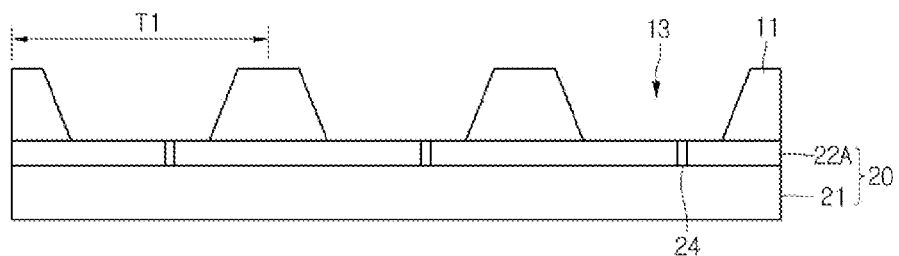

Referring to FIGS. 6 and 7, the mold member 11 is attached onto the substrate 20 on which a lead electrode is provided. At this time, after the mold member 11 is arranged to allow the spacer part 24 of the substrate 20 to be disposed to the cavity 13, the mold member 11 is attached onto the substrate 20. Thus, the mold member 11 and the substrate 20 may be attached to each other by using an adhesive member of which a material may be identical to or different from that of the mold member 11. Further, the adhesive member may be a kind of an adhesive film, but the embodiment is not limited thereto.

Figure 8:
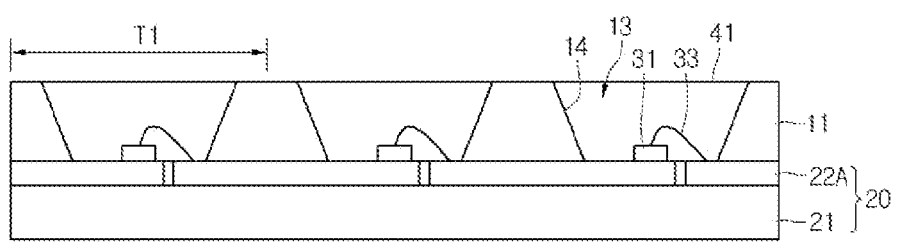

Referring to FIG. 8, the light emitting chip 31 is mounted on the lead electrode 22A exposed to the cavity 13 of the mold member 11 disposed on the substrate 20, and the light emitting chip 31 is connected to another lead electrode 22A with the connecting member 33.

In addition, the cavity 13 of the mold member 11 is filled with the resin member 41. The resin member 41 may be formed through a squeeze scheme or a dispensing scheme, but the embodiment is not limited thereto.

Then, the light emitting device as shown in FIG. 1 is provided by cutting it in units of an individual package T1.

In the embodiment, after the adhesive film 55 is attached on the first molding frame 51, the mold member 11 is formed and then, the adhesive film 55 is removed. Then, by attaching the mold member 11 onto the substrate 20, the lead electrode 22A disposed on the substrate 20 may be prevented from making contact with the second molding frame 52. The attachment of the mold member 11 may be realized by using an adhesive having a material which is identical to or different from that of the mold member 11.

Here, according to a method of fabricating a light emitting device of the related art, if the second molding frame makes contact with a lead electrode through an injection molding scheme after disposing the lead electrode and the mold member 52 is injected, a portion of the mold member 52 may be injected between a convex portion of the second molding frame and the lead electrode. In this case, a resin film is formed on a surface of the lead electrode and a resin film deflashing process is performed before a light emitting chip 31 is mounted. That is, if the resin film of the surface of the lead electrode is not removed, the bondability of a wire may be deteriorated when bonding the wire. Further, a fault may be caused due to a foreign substance or a resin film of the surface of the lead electrode. According to the embodiment, by removing the adhesive film 55 disposed below the mold member 11, the resin film may be prevented from being formed on the lead electrode of the substrate 20. Thus, the resin film deflashing process is unnecessary and the faults that occur due to the foreign substances in the cavity 13 of the mold member 11 may be reduced. In the light emitting device fabricated according to the above, since the resin film does not remain on the surface of the lead electrode disposed on the bottom of the cavity 13, the luminance efficiency and the electric reliability may be improved.

Figure 9:
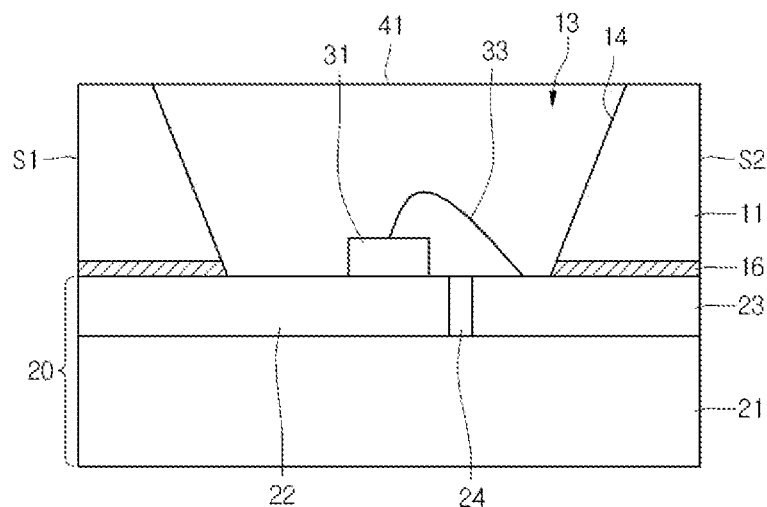
FIG. 9 is a side sectional view of a light emitting device according to the second embodiment.

FIG. 9 is a side sectional view of a light emitting device according to the second embodiment. In the following description of the second embodiment, the same parts as those of the first embodiment will refer to the description of the first embodiment.

Referring to FIG. 9, the light emitting device 101 includes a mold member 11 having a cavity 13, a substrate 20 having first and second lead electrodes 22 and 23 under the mold member 11, a light emitting chip 31 disposed on at least one of the first and second lead electrodes 22 and 23, a resin member 41, and an adhesive film 16 between the substrate 20 and the mold member 11.

As the adhesive film 16 may be an insulation film, the adhesive film 16 may include a double-sided tape or an adhesive film of a resin material. The adhesive film 16 may be formed of a non-transmissive material or a reflective material. Such a non-transmissive or reflective adhesive film may reduce a light loss. A thickness of the adhesive film 16 may be thicker than the thickness formed by using an adhesive.

The adhesive film 16 includes an open region corresponding to the cavity 13 of the mold member 11. A width of the open region may be equal to or narrower than that of a bottom surface of the cavity 13. An inner wall of the adhesive film 16 may be exposed toward the cavity 13 and may be inclined or vertical to the bottom surface of the cavity 13, but the embodiment is not limited thereto. A portion of the adhesive film 16 may be further provided between a top surface of the spacer part 24 and a bottom surface of the mold member 11.

The resin member 41 may make contact with an inner wall of the adhesive film 16. Since the inner wall of the adhesive film 16 makes contact with an inner wall of the mold member 11, an expansion of the mold member 11 may be restrained and a wire short fault which occurs due to the expansion of the mold member 11 may be prevented.

FIGS. 10 to 14 are views illustrating a process of fabricating the light emitting device of FIG. 9. In the following description about the second embodiment, description about the first embodiment will be incorporated by reference.

Figure 10:
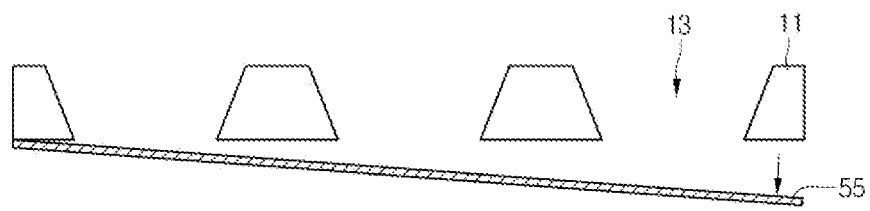
FIGS. 10 to 14 are views illustrating a process of fabricating the light emitting device of FIG. 9.
Figure 11:
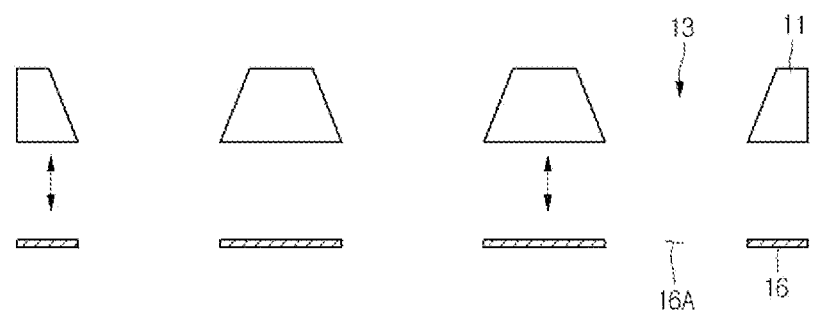

Referring to FIGS. 10 and 11, the mold member 11 as shown in FIGS. 2 and 3 is fabricated. Then, the adhesive film 55 disposed below the mold member 11 is removed. The adhesive film 16 having an open region 16A corresponding to the cavity 13 is disposed under the mold member 11. The adhesive film 16 is attached onto the entire bottom surface or a portion of the bottom surface of the mold member 11. As another example, the adhesive film 16 may be first attached onto the top surface of the substrate 20.

Figure 12:
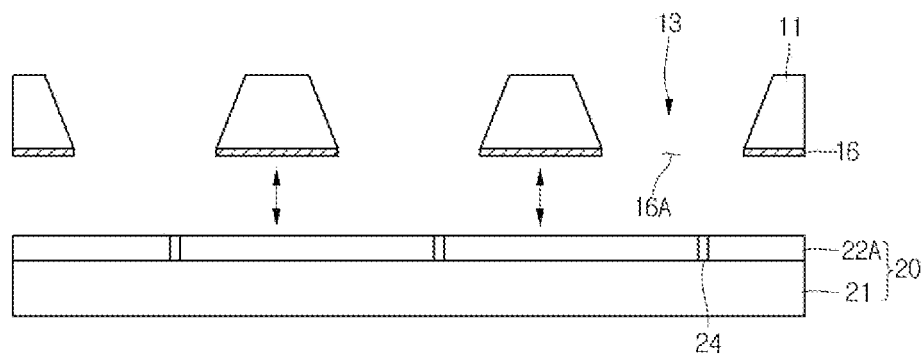
Figure 13:
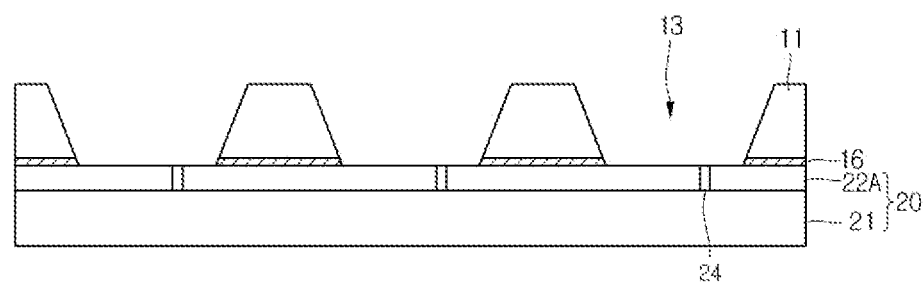

Referring to FIGS. 12 and 13, the adhesive film 16 is attached onto the bottom surface of the mold member 11 and the top surface of the substrate 20. Here, the spacer part 24, which is between the lead electrodes 22A of the substrate 20, is disposed on the bottom of the cavity 13 of the mold member 11. The adhesive film 16 allows the mold member 11 and the substrate 20 to be attached to each other.

Figure 14:
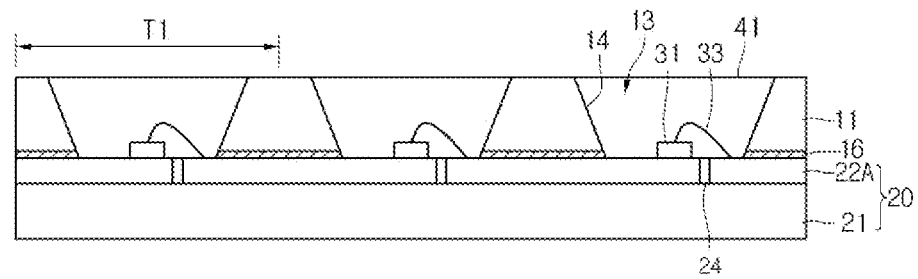

Referring FIG. 14, the light emitting chip 31 is mounted on the lead electrode 22A disposed in the cavity 13 of the mold member 11 and the lead electrode 22A is electrically connected to the light emitting chip 31 through the connecting member 33. In addition, the mold member 41 is filled with the resin member 11 and then, the resin member 41 is hardened.

The light emitting device as shown in FIG. 9 is fabricated by cutting it in units of an individual package T1.

Figure 15A:
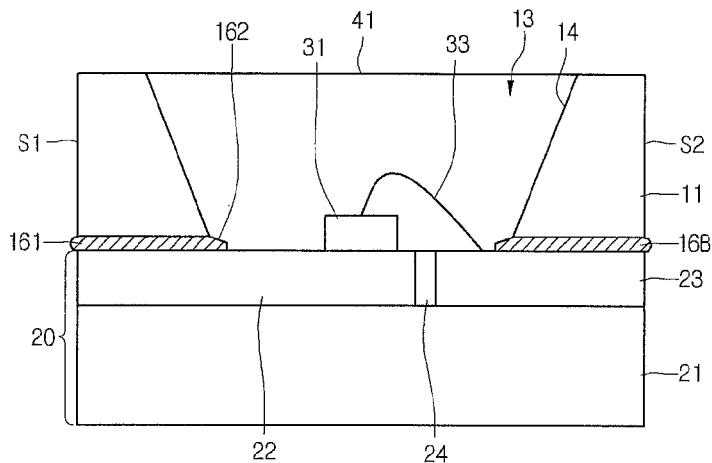
FIG. 15A is a side sectional view of a light emitting device according to the third embodiment and FIG. 15B is a side view illustrating the light emitting device shown in FIG. 15A.
Figure 15B:
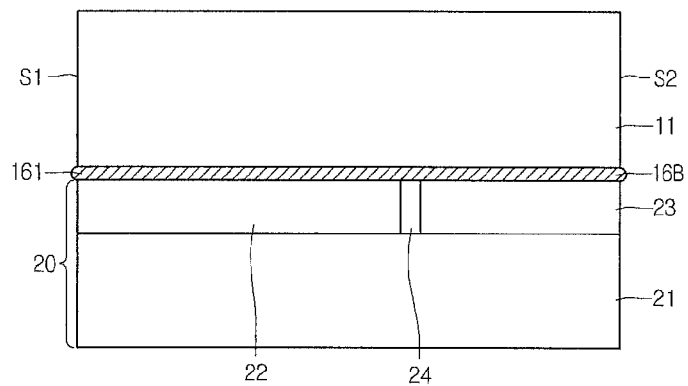

FIG. 15A is a side sectional view of a light emitting device according to the third embodiment. FIG. 15B is a side view of the light emitting device of FIG. 15A. In the following description of the third embodiment, the same parts as those of the first embodiment will refer to the description of the first embodiment.

Referring to FIGS. 15A and 15B, the light emitting device 102 includes a mold member 11 having a cavity 13, a substrate 20 having first and second lead electrodes 22 and 23 under the mold member 11, a light emitting chip 31 disposed on at least one of the first and second lead electrodes 22 and 23, a resin member 41, and an adhesive member 16B between the substrate 20 and the mold member 11.

The adhesive member 16B may be formed of an adhesive material such as silicon or epoxy. The adhesive member 16B is an amorphous material and has a thickness different from that of a fixed material such as a film.

At least portion of the adhesive member 16B may protrude from the bottom region of the mold member 11. For example, an outer portion 161 of the adhesive member 16B may protrude outward further than the outer wall of the mold member 11 and an inner portion 162 of the adhesive member 16B may protrude inward further than the side wall 14 of the cavity 13. The inner portion 162 which protrudes from the adhesive member 16B may make contact with the bottom surface of the resin member 41, but the embodiment is not limited thereto.

Figure 16:
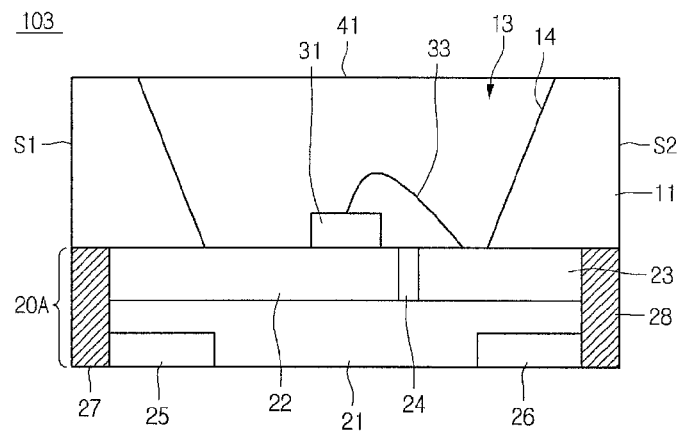
FIG. 16 is a side sectional view of a light emitting device according to the fourth embodiment.

FIG. 16 is a side sectional view of a light emitting device according to the fourth embodiment. In the following description of the fourth embodiment, the same parts as those of the first embodiment will refer to the description of the first embodiment.

Referring to FIG. 16, the light emitting device 103 includes a mold member 11, a substrate 20A having first and second lead electrodes 22 and 23 under the mold member 11, a light emitting chip 31 disposed on at least one of the first and second lead electrodes 22 and 23, and a resin member 41.

The substrate 20A includes a support member 21, the first and second lead electrodes 22 and 23, first and second connecting electrodes 27 and 28, and first and second lead parts 25 and 26.

The first lead electrode 22 of the substrate 20A is connected to the first lead part 25 through the first connecting electrode 27, and the second lead electrode 23 is connected to the second lead part 26 through the second connecting electrode 28. The first connecting electrode 27 may be disposed on a first outer wall of the substrate 20A, or may be formed in a via structure in the substrate 20A. The first connecting electrode 27 connects the first lead electrode 22 and the first lead part 25 to each other. The second connecting electrode 28 may be disposed on a second outer wall of the substrate 20A opposite to the first outer wall, or may be formed in a via structure in the substrate 20A. The second connecting electrode 28 connects the second lead electrode 23 and the second lead part 26 to each other. The first and second lead parts 25 and 26 are disposed on the bottom surface of the substrate 20A and are spaced apart from each other.

The first and second lead parts 25 and 26 are spaced apart from each other on the bottom surface of the substrate 20, are attached onto a module substrate with an adhesive member, and supply electric power. The bottom surfaces of the first and second lead parts 25 and 26 may be disposed under the support member 21 or the same plane as that of support member 21.

Figure 17:
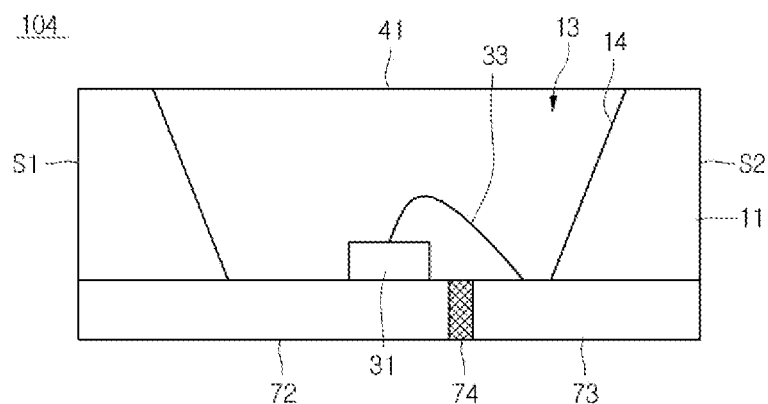
FIG. 17 is a side sectional view of a light emitting device according to the fifth embodiment.

FIG. 17 is a side sectional view of a light emitting device according to the fifth embodiment. In the following description of the fifth embodiment, the same parts as those of the first embodiment will refer to the description of the first embodiment.

Referring to FIG. 17, the light emitting device 104 includes a mold member 11, a light emitting chip 31, a resin member 41, first and second lead electrodes 72 and 73 and a spacer part 74.

The spacer part 74 is disposed between the first and second lead electrodes 72 and 73, and may be formed of an insulation material such as a metallic oxide or a metallic nitride. The spacer part 74 may be formed of a non-transmissive material, but the embodiment is not limited thereto. The spacer part 74 may include at least one of $SiO_2$, $SiO_x$, $SiO_xN_y$, $Si_3N_4$, $Al_2O_3$, and $TiO_2$. The spacer part 74 may protrude above the top surfaces of the first and second lead electrodes 72 and 73. The spacer part 74 and the mold member 11 support and fix the first and second lead electrodes 72 and 73.

The first and second lead electrodes 72 and 73 may make contact with the bottom surface of the mold member 11. As shown in FIG. 4, the first and second lead electrodes 72 and 73 are attached on the bottom surface of the mold member 11 after an adhesive film is removed from the mold member 11, so that a resin film is not formed on the top surfaces of the first and second lead electrodes 72 and 73. The first and second lead electrodes 72 and 73 may have the thickness of 0.5 mm or above, but the embodiment is not limited thereto.

Figure 18:
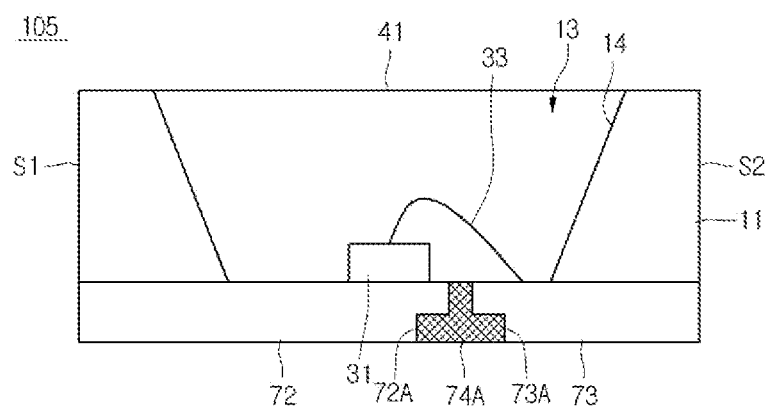
FIG. 18 is a side sectional view of a light emitting device according to the sixth embodiment.

FIG. 18 is a side sectional view of a light emitting device according to the sixth embodiment. In the following description of the sixth embodiment, the same parts as those of the first embodiment will refer to the description of the first embodiment.

Referring to FIG. 18, the light emitting device 105 includes a mold member 11, a light emitting chip 31, a resin member 41, first and second lead electrodes 72 and 73 and a spacer part 74A. The first lead electrode 72 includes a recess region 72A in a region corresponding to the second lead electrode 73. The second lead electrode 73 includes a recess region 73A in a region corresponding to the first lead electrode 72.

The spacer part 74A is disposed between the first and second lead electrodes 72 and 73, and may be formed of an insulation material such as a metallic oxide or a metallic nitride. The spacer part 74A is disposed in the recess regions (72A and 73A) and has a width of a lower portion larger than that of an upper portion. A contact area of the spacer part 74A with the first and second lead electrodes 72 and 73 may be increased and may restrain moisture penetration. Further, the first and second lead electrodes 72 and 73 may include an uneven structure roughed to the recess regions 72A and 73A in which the spacer part 74 is disposed, but the embodiment is not limited thereto.

Figure 19:
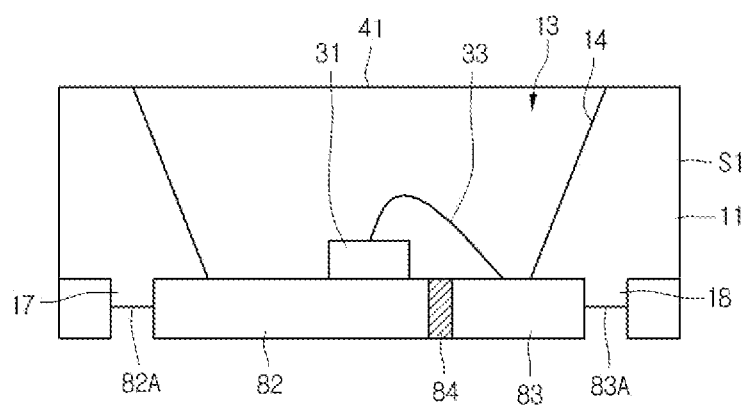
FIG. 19 is a side sectional view of a light emitting device according to the seventh embodiment.

FIG. 19 is a side sectional view of a light emitting device according to the seventh embodiment. In the following description of the seventh embodiment, the same parts as those of the first embodiment will refer to the description of the first embodiment.

Referring to FIG. 18, the light emitting device 106 includes a mold member 11, a light emitting chip 31, a resin member 41, first and second lead electrodes 82 and 83 and a spacer part 84. The first lead electrode 82 includes at least one first coupling hole 82A formed therein. The second lead electrode 83 includes at least one second coupling hole 83A formed therein. The first coupling hole 82A is at least one which is formed under the region corresponding to the mold member 11. The second coupling hole 83A is at least one which is formed under the region corresponding to the mold member 11.

A first protrusion 17 of the mold member 11 is coupled with the first coupling hole 82A. A height of the first protrusion 17 may be equal to or smaller than a depth of the first coupling hole 82A.

Figure 20:
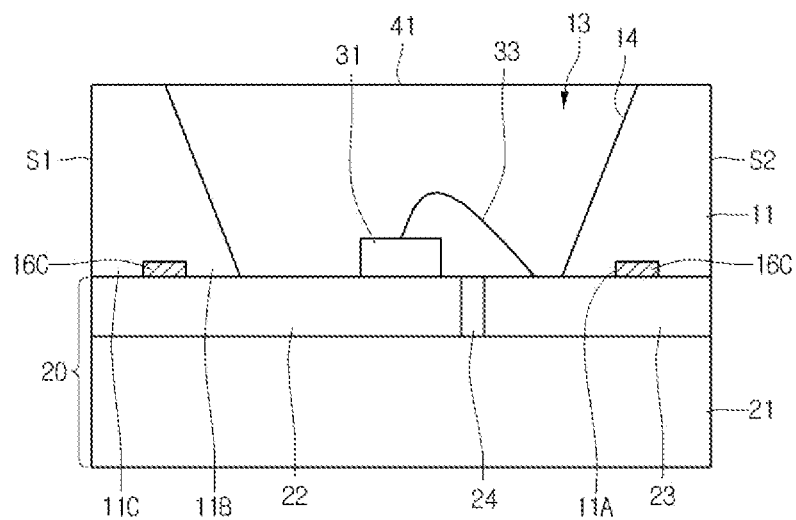
FIG. 20 is a side sectional view of a light emitting device according to the eighth embodiment.

A second protrusion 18 of the mold member 11 is coupled with the second coupling hole 83A. A height of the second protrusion 18 may be equal to or less than a depth of the second coupling hole 83A FIG. 20 is a side sectional view of a light emitting device according to the eighth embodiment. In the following description of the eighth embodiment, the same parts as those of the second embodiment will refer to the description of the second embodiment.

Referring to FIG. 20, the light emitting device 107 includes a mold member 11 having a cavity 13, a substrate 20 having first and second lead electrodes 22 and 23 under the mold member 11, a light emitting chip 31 disposed on at least one of the first and second lead electrodes 22 and 23, a resin member 41, and an adhesive film 16C between the substrate 20 and the mold member 11.

The adhesive film 16C is disposed on a portion of a bottom surface of the mold member 11 and disposed between a side wall of the cavity 13 and first and second outer walls S1 and S2 of the mold member 11. The adhesive film 16C is disposed in a portion of the region between the bottom surface of the mold member 11 and the first and second lead electrodes 22 and 23, so that the mold member 11 is adhesive with the lead electrodes 22 and 23.

A recess 11A may be formed in a lower portion of the mold member 11 and the adhesive film 16C may be disposed in the recess 11A. The mold member 11 includes an inner portion 11B disposed between the adhesive film 16C and the cavity 13 and an outer portion 11C outside the adhesive film 16C. Thus, the adhesive film 16C may be coupled with the recess 11A of the mold member 11 in an embedded structure. Further, the inner and outer portions 11B and 11C of the mold member 11 may make contact with the top surfaces of the first and second lead electrodes 22 and 23. Since the adhesive film 16C is disposed to be unexposed from the inner and outer walls of the mold member 11, a light loss which may occur in the cavity may be reduced.

Figure 21:
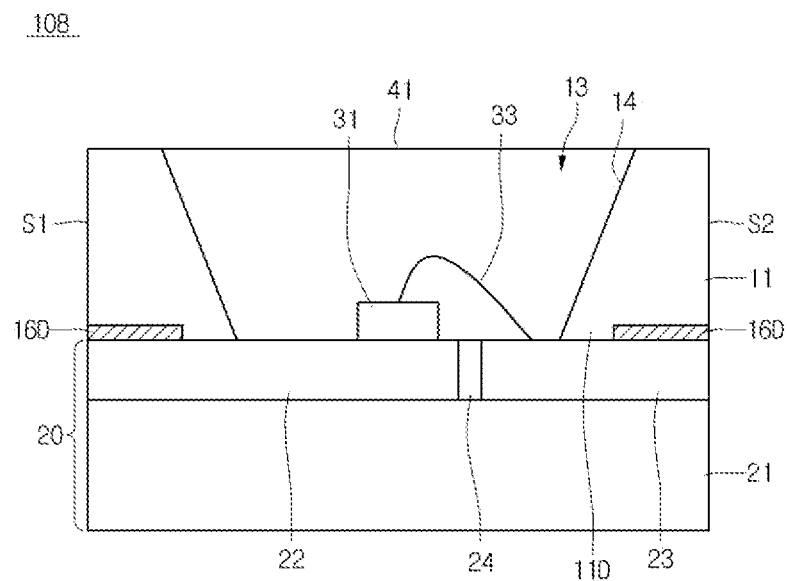
FIG. 21 is a side sectional view of a light emitting device according to the ninth embodiment.

FIG. 21 is a side sectional view of a light emitting device according to the ninth embodiment. In the following description of the ninth embodiment, the same parts as those of the second embodiment will refer to the description of the second embodiment.

Referring to FIG. 21, the light emitting device 108 includes a mold member 11 having a cavity 13, a substrate 20 having first and second lead electrodes 22 and 23 under the mold member 11, a light emitting chip 31 disposed on at least one of the first and second lead electrodes 22 and 23, a resin member 41, and an adhesive film 16D between the substrate 20 and the mold member 11.

The adhesive film 16D is disposed between the bottom surface of the mold member 11 and the top surfaces of the first and second lead electrodes 22 and 23 and allows the mold member 11 to be adhesive onto the substrate 20.

An inner portion 11D of the mold member 11 is disposed between the adhesive film 16D and the cavity 13. The adhesive film 16D is spaced apart from the cavity 13. Thus, a light source which may occur due to the adhesive film 16D in the cavity 13 may be reduced.

Figure 22:
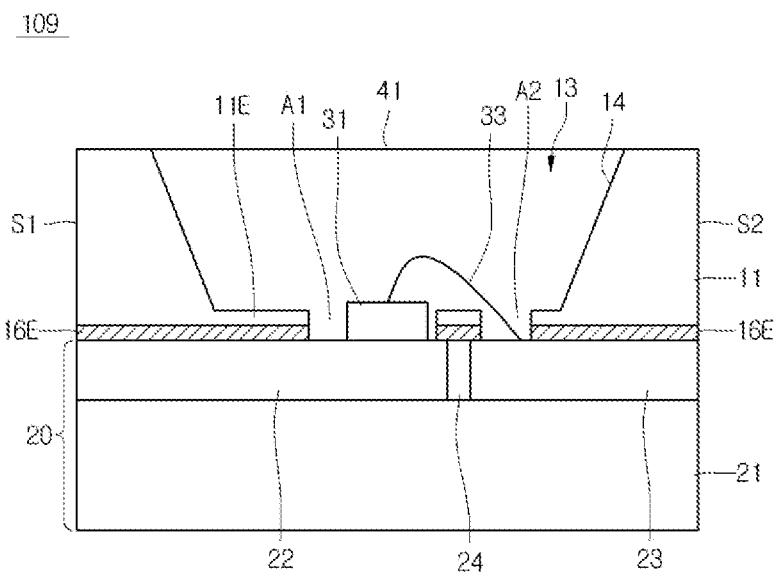
FIG. 22 is a side sectional view of a light emitting device according to the tenth embodiment.

FIG. 22 is a side sectional view of a light emitting device according to the tenth embodiment. In the following description of the tenth embodiment, the same parts as those of the second embodiment will refer to the description of the second embodiment.

Referring to FIG. 22, the light emitting device 109 includes a mold member 11 having a cavity 13, a substrate 20 having first and second lead electrodes 22 and 23 under the mold member 11, a light emitting chip 31 disposed on at least one of the first and second lead electrodes 22 and 23, a resin member 41, and an adhesive film 16E between the substrate 20 and the mold member 11.

An extension portion 11E of the mold member 11 extends to an inner region of the cavity 13 and is closer to the light emitting chip 31 than an inclined side wall 14. The first and second open regions A1 and A2 are disposed in the extension portion 11E of the mold member 11. A portion of the first lead electrode 22 is exposed through the first open region A1. The light emitting chip 31 may be exposed through the first open region A1. A portion of the second lead electrode 23 is exposed through the second open region A2. A connecting member 33 is disposed to be connected to the light emitting chip 31 in the second open region A2.

The adhesive film 16E may further extend between the extension portion 11E of the mold member 11 and the first and second lead electrodes 22 and 23. Further, the extension portion 11E of the mold member 11 is disposed on the spacer part 24 to allow the light emitting chip 31 and the second open region A2 to be spaced apart from each other.

Figure 23:
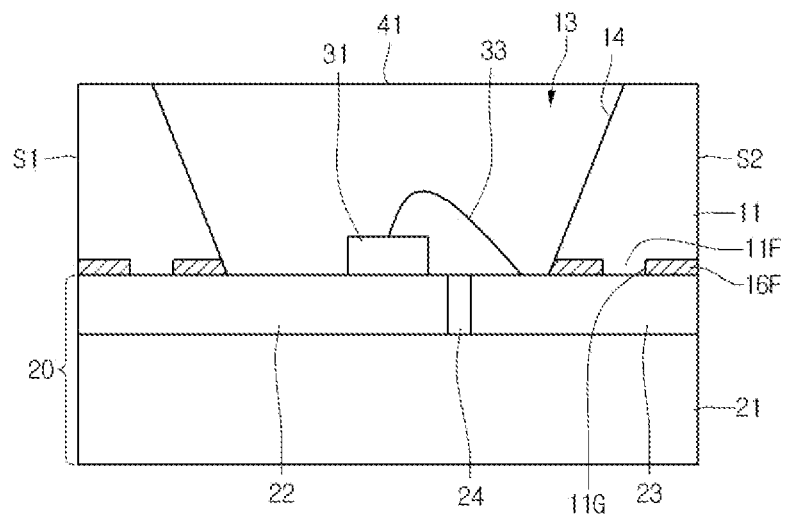
FIG. 23 is a side sectional view of a light emitting device according to the eleventh embodiment.

FIG. 23 is a side sectional view of a light emitting device according to the eleventh embodiment. In the following description of the eleventh embodiment, the same parts as those of the second embodiment will refer to the description of the second embodiment.

Referring to FIG. 23, the light emitting device 110 includes a mold member 11 having a cavity 13, a substrate 20 having first and second lead electrodes 22 and 23 under the mold member 11, a light emitting chip 31 disposed on at least one of the first and second lead electrodes 22 and 23, a resin member 41, and an adhesive film 16F between the substrate 20 and the mold member 11.

A hole 11G is formed in the adhesive film 16F and a protrusion 11F of the mold member 11 is coupled to the hole 11G. The protrusion 11F of the mold member 1 is adhesive onto the top surfaces of the first and second lead electrodes 22 and 23, so that the mold member 11 may be coupled with the adhesive film 16F and the first and second lead electrodes 22 and 23.

The adhesive film 16F may be exposed to the cavity 13 and outer walls S1 and S2 of the mold member 11, but the embodiment is not limited thereto. Further, the adhesive film 16F and the mold member 11 may further include an extension portion as shown in FIG. 22, but the embodiment is not limited thereto.

Figure 24:
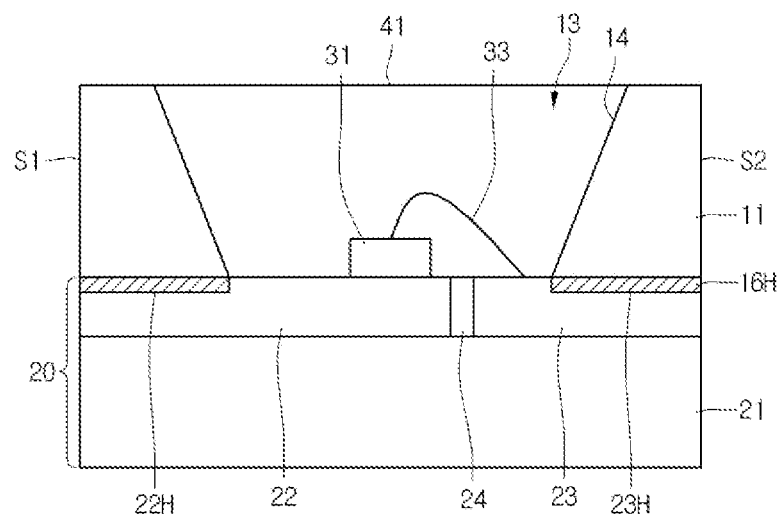
FIG. 24 is a side sectional view of a light emitting device according to the twelfth embodiment.

FIG. 24 is a side sectional view of a light emitting device according to the twelfth embodiment. In the following description of the twelfth embodiment, the same parts as those of the second embodiment will refer to the description of the second embodiment.

Referring to FIG. 24, the light emitting device 111 includes a mold member 11 having a cavity 13, a substrate 20 having first and second lead electrodes 22 and 23 under the mold member 11, a light emitting chip 31 disposed on at least one of the first and second lead electrodes 22 and 23, a resin member 41, and an adhesive film 16H between the substrate 20 and the mold member 11.

A recess region 22H, which is concaved lower than the top surface of the first lead electrode 22, is disposed on the top surface of the first lead electrode 22. A recess region 23H, which is concaved lower than the top surface of the second lead electrode 23, is disposed on the top surface of the second lead electrode 23.

The recess regions 22H and 23H of the first and second lead electrodes 22 and 23 may be exposed to or spaced apart from the bottom surface of the cavity 13.

The adhesive film 16H may be disposed in the recess regions 22H and 23H of the first and second lead electrodes 22 and 23. The adhesive film 16H may be formed such that a thickness of the adhesive film 16H is equal to or larger than a depth of the recess regions 22H and 23H. The top surfaces of the adhesive film 16H and the first and second lead electrodes 22 and 23 may be disposed on all the same plane. The top surface of the adhesive film 16H may protrude over the top surfaces of the first and second lead electrodes 22 and 23.

The adhesive film 16H allows the substrate 20 and the mold member 11 to be adhesive to each other. Here, the substrate 20 may include the adhesive film 16H, but the embodiment is not limited.

Further, a width of the adhesive film 16H may be equal to, narrower or wider than that of the bottom width of the mold member 11. When the width of the adhesive film 16H is wider than that of the bottom surface of the mold member 11, the adhesive strength of the adhesive film 16H to the first and second lead electrodes 22 and 23 may be increased. When the width of the adhesive film 16H is narrower than that of the bottom surface of the mold member 11, a portion of the mold member 11 may be adhesive to the first and second lead electrodes 22 and 23.

The adhesive film 16H and the mold member 11 may further include an extension portion as shown in FIG. 22, but the embodiment is not limited thereto.

Figure 25:
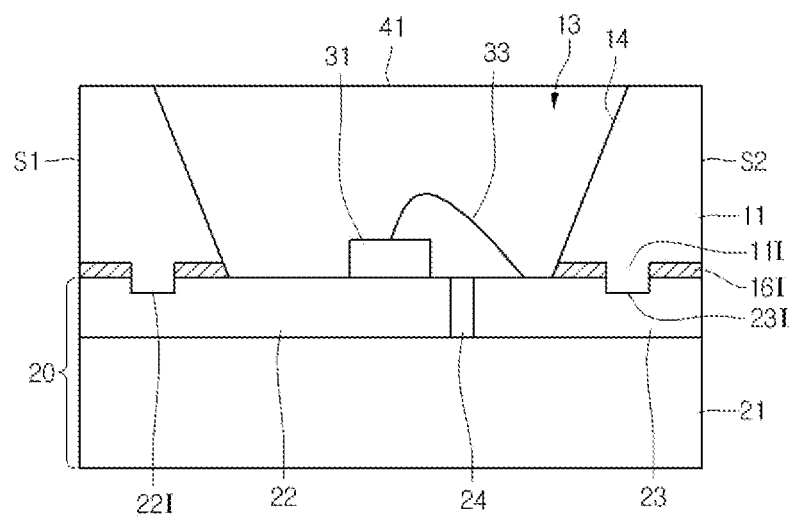
FIG. 25 is a side sectional view of a light emitting device according to the thirteenth embodiment.

FIG. 25 is a side sectional view of a light emitting device according to the thirteenth embodiment. In the following description of the thirteenth embodiment, the same parts as those of the second embodiment will refer to the description of the second embodiment Referring to FIG. 25, the light emitting device 112 includes a mold member 11 having a cavity 13, a substrate 20 having first and second lead electrodes 22 and 23 under the mold member 11, a light emitting chip 31 disposed on at least one of the first and second lead electrodes 22 and 23, a resin member 41, and an adhesive film 16I between the substrate 20 and the mold member 11.

Recess 22I and 23I are disposed in regions of the first and second lead electrodes 22 and 23 corresponding to the mold member 11. Regions of the adhesive film 16I corresponding to the recess 22I and 23I are opened. Thus, the protrusions 11I of the mold member 11 are coupled with the recess 22I and 23I through the open regions of the adhesive film 16I. Thus, the mold member 11 may be fixed to the recess 22I and 23I with the adhesive film 16I. The protrusions 11I of the mold member 11 protrude under the bottom surface of the adhesive film 16I, so that the adhesive strength of the mold member 11 may be increased. Further, by providing an adhesive into the recess 22I and 23I, the recess 22I and 23I are adhesive to the protrusions 11I of the mold member 11.

The adhesive film 16I and the mold member 11 may further include an extension portion as shown in FIG. 22, but the embodiment is not limited thereto.

<Lighting System>

The light emitting device according to the embodiments may be applied to a lighting system. The light system may have an array structure including a plurality of light emitting devices. The lighting system may include a display apparatus shown in FIGS. 26 and 27, a light unit shown in FIG. 28, in addition to a lighting lamp, a signal light, a vehicle headlight, an electronic display, etc.

Figure 26:
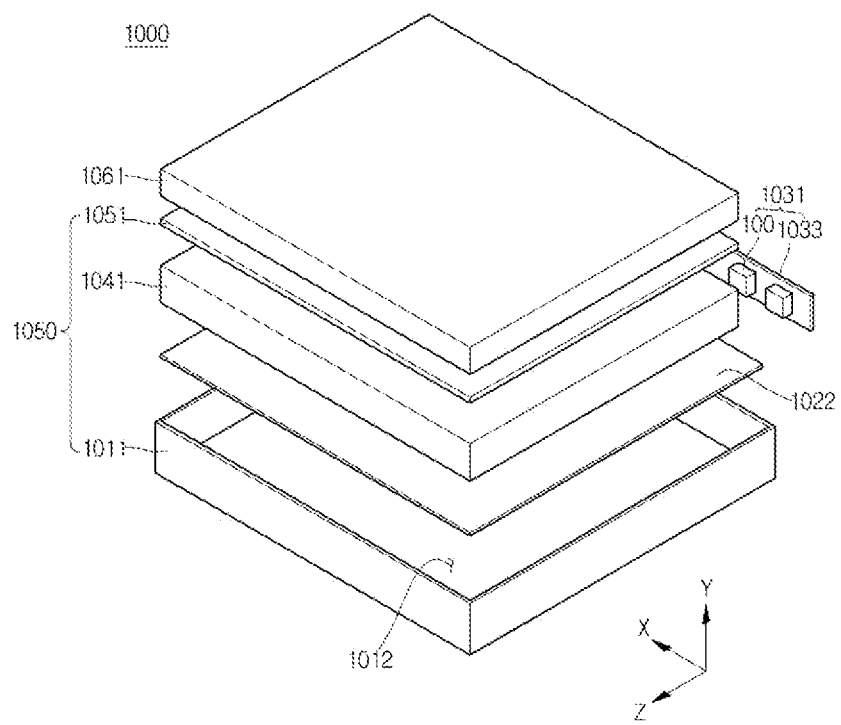
FIG. 26 is a disassembled perspective view of a display apparatus provided with the light emitting device.

FIG. 26 is a disassembled perspective view of a display apparatus according to an embodiment.

Referring to FIG. 26, the display apparatus 1000 according to the embodiment may include a light guide plate 1041, a light emitting module 1031 supplying light to the light guide plate 1041, a reflective member 1022 under the light guide plate 1041, an optical sheet 1051 on the light guide plate 1041, a display panel 1061 on the optical sheet 1051, and a bottom cover 1011 receiving the light guide plate 1041, the light emitting module 1031, and the reflective member 1022, but the present disclosure is not limited thereto.

The bottom cover 1011, the reflective member 1022, the light guide plate 1041, and the optical sheet 1051 may be defined as a light unit 1050.

The light guide plate 1041 functions to transform linear light to planar light by diffusing the linear light. The light guide plate 1041 may be made of a transparent material, and may include one of acryl-series resin such as polymethyl metaacrylate (PMMA), polyethylene terephthlate (PET), poly carbonate (PC), COC, and polyethylene naphthalate resin.

The light emitting module 1031 provides light to at least a side surface of the light guide plate 1041, and finally acts as a light source of a display apparatus.

The light emitting module 1031 may include at least one light emitting module in the bottom cover 1011, and provide light directly or indirectly from one side surface of the light guide plate 1041. The light emitting module 1031 may include a board 1033, and a light emitting device 100 according to embodiments disclosed above, and the light emitting devices 100 may be arranged apart by a predetermined interval from each other on the board 1033.

The board 1033 may be a printed circuit board (PCB) including a circuit pattern (not shown). The board 1033 may include a metal core PCB (MCPCB), a flexible PCB (FPCB), etc. as well as the general PCB, but the present disclosure is not limited thereto. In the case where the light emitting device 100 is mounted on a side surface or a radiant heat plate, the board 1033 may be removed. Herein, some of the radiant heat plate may contact an upper surface of the bottom cover 1011.

The plurality of light emitting devices 100 may be mounted on the board 1033 such that light emitting surfaces of the plurality of light emitting devices 100 are spaced apart by a predetermined distance from the light guide plate 1041, but the present disclosure is not limited thereto. The light emitting device 100 may supply light to a light incident part that is one side surface of the light guide plate 1041, directly or indirectly, but the present disclosure is not limited thereto.

The reflective member 1022 may be provided under the light guide plate 1041. The reflective member 1022 reflects light incident from a lower surface of the light guide plate 1041 to allow the reflected light to be directed toward an upper direction, thereby capable of enhancing brightness of the light unit 1050. The reflective member 1022 may be formed of, for example, PET, PC, PVC resin, or the like, but the present disclosure is not limited thereto.

The bottom cover 1011 may receive the light guide plate 1041, the light emitting module 1031, the reflective member 1022, and the like. For this purpose, the bottom cover 1011 may have a receiving part 1012 formed in a box shape a top surface of which is opened, but the present disclosure is not limited thereto. The bottom cover 1011 may be coupled to a top cover, but the present disclosure is not limited thereto.

The bottom cover 1011 may be formed of a metal material or resin material, and may be manufactured by using a process such as a press molding or an injection molding. Also, the bottom cover 1011 may include metallic or nonmetallic material having a high thermal conductivity, but the present disclosure is not limited thereto.

The display panel 1061 is, for example, an LCD panel, and includes first and second transparent substrates facing each other, and a liquid crystal layer interposed between the first and second substrates. A polarizing plate may be attached on at least one surface of the display panel 1061, but the present disclosure is not limited thereto. The display panel 1061 displays information by using light passing through the optical sheet 1051. The display apparatus 1000 may be applied to a variety of mobile terminals, monitors for notebook computers, monitors for lap-top computers, televisions, etc.

The optical sheet 1051 is disposed between the display panel 1061 and the light guide plate 1041, and includes at least one transparent sheet. The optical sheet 1051 may include, for example, at least one of a diffusion sheet, a horizontal and/or vertical prism sheet, and a brightness reinforcing sheet. The diffusion sheet diffuses incident light, the horizontal and/or vertical prism sheet focuses incident light on a display region, and the brightness reinforcing sheet enhances the brightness by reusing lost light. Also, a protective sheet may be disposed on the display panel 1061, but the present disclosure is not limited thereto. Herein, the display apparatus 1000 may include the light guide plate 1041, and the optical sheet 1051 as optical members positioned on a light path of the light emitting module 1031, but the present disclosure is not limited thereto.

Figure 27:
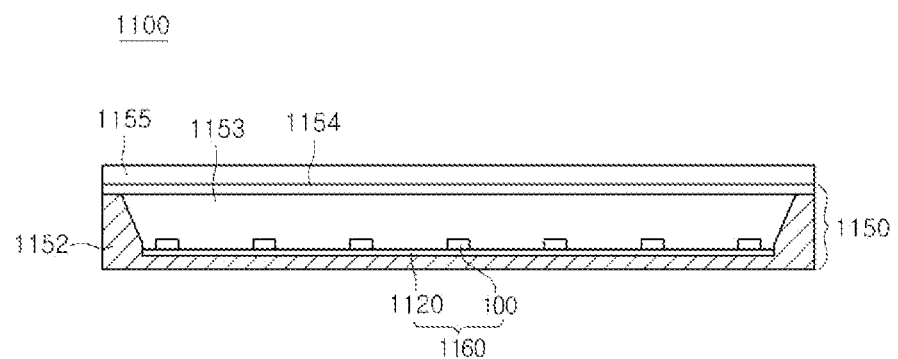
FIG. 27 is a schematic sectional view illustrating another example of a display apparatus provided with the light emitting device.

FIG. 27 is a cross-sectional view of a display apparatus according to an embodiment.

Referring to FIG. 27, the display apparatus 1100 includes a bottom cover 1152, a board 1120 on which the light emitting devices 100 disclosed above are arrayed, an optical member 1154, and a display panel 1155.

The board 1120 and the light emitting device 100 may be defined as a light emitting module 1160. The bottom cover 1152, the at least one light emitting module 1160, and the optical member 154 may be defined as a light unit.

The bottom cover 1152 may be provided with a receiving part, but the present disclosure is not limited thereto.

Herein, the optical member 1154 may include at least one of a lens, a light guide plate, a diffusion sheet, a horizontal and vertical prism sheet, and a brightness reinforcing sheet. The light guide plate may be formed of polycarbonate (PC) or poly methyl methacrylate (PMMA), and may be removed. The diffusion sheet diffuses incident light, the horizontal and vertical prism sheet focuses incident light on a display region, and the brightness reinforcing sheet enhances the brightness by reusing lost light.

The optical member 1154 is disposed on the light emitting module 1160. The optical member 154 transforms light emitted from the light emitting module 1160 to planar light, and performs diffusion, light focusing, and the like.

Figure 28:
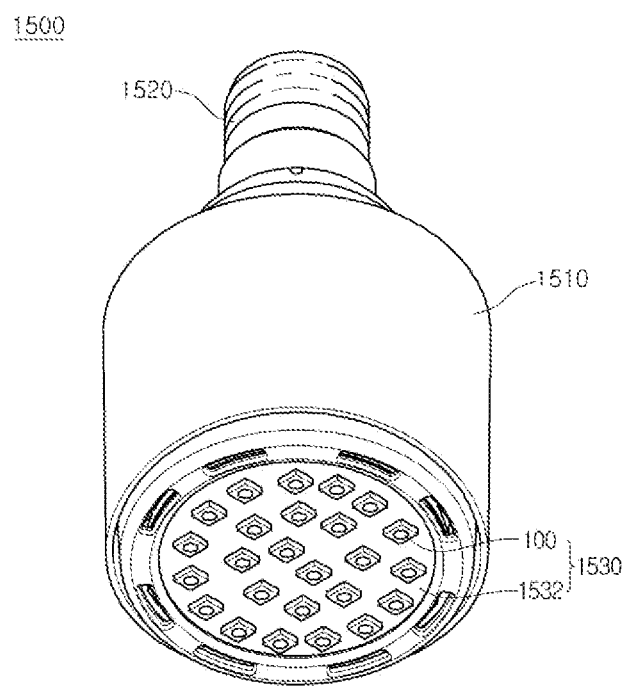
FIG. 28 is a perspective view of a lighting unit provided with the light emitting device.

FIG. 28 is a perspective view of a lighting unit according to an embodiment.

Referring to FIG. 28, the lighting unit 1500 may include a case 1510, a light emitting module 1530 including in the case 1510, and a connection terminal 1520 including in the case 1510 and supplied with an electric power from an external power supply.

The case 1510 may be preferably formed of a material having good heat shielding characteristics, for example, a metal material or a resin material.

The light emitting module 1530 may include a board 1532, and at least one light emitting device 100 according to the embodiments mounted on the board 1532. The light emitting device 100 may include a plurality of light emitting devices which are arrayed apart by a predetermined distance from one another in a matrix configuration.

The board 1532 may be an insulator substrate on which a circuit pattern is printed, and may include, for example, a printed circuit board (PCB), a metal core PCB, a flexible PCB, a ceramic PCB, an FR-4 substrate, etc.

Also, the board 1532 may be formed of a material to efficiently reflect light, and a surface thereof may be formed in a color capable of efficiently reflecting light, for example, white color, or silver color.

The at least one light emitting devices 100 may be mounted on the board 1532. Each of the light emitting devices 100 may include at least one light emitting diode (LED) chip. The LED chip may include a color LED emitting red, green, blue or white light, and a UV LED emitting ultraviolet (UV).

The light emitting module 1530 may have a combination of various light emitting devices so as to obtain desired color and luminance. For example, the light emitting module 1530 may have a combination of a white LED, a red LED, and a green LED so as to obtain a high color rendering index (CRI).

The connection terminal 1520 may be electrically connected to the light emitting module 1530 to supply power. The connection terminal 1520 may be screwed and coupled to an external power in a socket type, but the present disclosure is not limited thereto. For example, the connection terminal 1520 may be made in a pin type and inserted into an external power, or may be connected to the external power through a power line.

A method of fabricating a light emitting device according to the embodiment includes: forming a mold member having a cavity on an adhesive film; removing the adhesive film from the mold member; coupling a substrate on which a plurality of lead electrodes are disposed to a lower portion of under the mold member; disposing a light emitting chip on the lead electrode of the substrate disposed in a cavity of the mold member; and forming a transmissive resin member in the cavity of the mold member.

According to the embodiments, the wire bondability of a light emitting device may be improved. The light emitting device in which the substrate having a material different from that of the mold member may be provided. The yield of the light emitting device may be improved. The reliability of the light emitting device may be improved. The reliability of a light unit having the light emitting device may be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a substrate including a plurality of lead electrodes;
a mold member including a cavity on the substrate;
a light emitting chip in the cavity and on at least one of the plurality of lead electrodes;
a connecting member for electrically connecting at least one of the plurality of lead electrodes to the light emitting chip;
a resin member in the cavity;
a spacer part between the plurality of lead electrodes, the spacer part including a material different from materials of the mold member and the resin member; and
an adhesive film between the mold member and the substrate,
wherein the spacer part includes a metallic oxide or a metallic nitride, and
wherein the mold member includes a resin material different from a material of the resin member.

2. The light emitting device of claim 1, wherein the adhesive film has a width wider than a width of a bottom surface of the mold member.

3. The light emitting device of claim 1, wherein the adhesive film protrudes inward further than a sidewall of the cavity.

4. The light emitting device of claim 3, wherein the adhesive film protrudes outward further than an outer wall of the mold member.

5. The light emitting device of claim 1, wherein the mold member includes an epoxy-based resin material and the resin member includes a silicon-based resin material.

6. The light emitting device of claim 1, wherein the adhesive film includes at least one of acrylic resin including PMMA (polymethyl methacrylate), PET (polyethylene terephthalate), PC (poly carbonate) resin, COC (cycloolefin copolymer) resin or PEN (polyethylene naphthalate) resin.

7. The light emitting device of claim 1, wherein the substrate includes a supporter member contacted with a lower surface of the plurality of lead electrodes and a lower surface of the spacer part.

8. The light emitting device of claim 7, wherein an outer wall of the mold member is disposed on the same plane as an outer wall of the support member of the substrate.

9. The light emitting device of claim 8, wherein the spacer part includes a metallic oxide or a metallic nitride, and
wherein the spacer part includes at least one of $SiO_2$, $SiO_x$, $SiO_xN_y$, $Si_3N_4$, $Al_2O_3$, or $TiO_2$.

10. The light emitting device of claim 1, wherein the adhesive film includes an open region having a smaller area than an area of a bottom portion of the cavity.

11. The light emitting device of claim 1, wherein the adhesive film includes a first protrusion protruded inward from a sidewall of the cavity and a second protrusion protruded outward from an outer wall of the mold member, and the first protrusion has a width different from the second protrusion.

12. A light emitting device comprising:
a substrate including a plurality of lead electrodes;
a mold member including a cavity on the substrate;
a light emitting chip in the cavity and on at least one of the plurality of lead electrodes;
a connecting member for electrically connecting at least one of the plurality of lead electrodes to the light emitting chip;
a resin member in the cavity;
a spacer part between the plurality of lead electrodes, the spacer part including a material different from materials of the mold member and the resin member; and
an adhesive member between the mold member and the substrate,
wherein the spacer part includes a metallic oxide or a metallic nitride,
wherein a portion of the spacer part is overlapped with the mold member, and
wherein the mold member includes a resin material different from a material of the resin member, and
wherein the adhesive member contacts the mold member.

13. The light emitting device of claim 12, wherein the lead electrodes include a recess region corresponding to the spacer part.

14. The light emitting device of claim 12, wherein the adhesive member includes a first protrusion protruded inward from a sidewall of the cavity and a second protrusion protruded outward from an outer wall of the mold member, and the first protrusion has a width wider than that of the second protrusion.

15. The light emitting device of claim 14, wherein the first protrusion of the adhesive member contacts the resin member.

16. The light emitting device of claim 15, wherein a top surface of the first protrusion of the adhesive member is located at a higher position than that of a bottom surface of the resin member.

17. The light emitting device of claim 12, wherein the spacer part includes at least one of $SiO_2$, $SiO_x$, $SiO_xN_y$, $Si_3N_4$, $Al_2O_3$, $TiO_2$.

18. The light emitting device of claim 12, wherein the mold member includes at least one of acid anhydride, an antioxidant, a release agent, an optical reflector, an inorganic filling agent, a curing catalyst, a light stabilizer, a lubricant, or a titanium dioxide.

19. The light emitting device of claim 12, wherein an inner portion of the adhesive member has an inclined surface.

20. The light emitting device of claim 12, wherein the substrate includes a supporter member contacted with a lower surface of the plurality of lead electrodes and a lower surface of the spacer part, and
   wherein an outer wall of the mold member is coplanar to an outer wall of the support member of the substrate.

* * * * *